June 2, 1970 J. W. BARNES ET AL 3,516,044

CARRIER FOR TRANSISTOR OUTLINE SEMICONDUCTOR DEVICE

Filed July 23, 1968 3 Sheets-Sheet 1

INVENTORS
JAMES W. BARNES
REXFORD W. VAN DE BOE
BY Seidel & Gonda
ATTORNEYS.

INVENTORS
JAMES W. BARNES
REXFORD W. VAN DE BOE
BY
Seidel & Gonda
ATTORNEYS.

CARRIER FOR TRANSISTOR OUTLINE SEMICONDUCTOR DEVICE

Filed July 23, 1968 3 Sheets-Sheet 3

INVENTORS
JAMES W. BARNES
REXFORD W. VAN DE BOE

BY Seidel & Gonda
ATTORNEYS.

United States Patent Office

3,516,044
Patented June 2, 1970

3,516,044

CARRIER FOR TRANSISTOR OUTLINE SEMICONDUCTOR DEVICE

James W. Barnes, Drexel Hill, and Rexford W. Van De Boe, Broomall, Pa., assignors to Barnes Corporation, Lansdowne, Pa., a corporation of Pennsylvania Filed July 23, 1968, Ser. No. 746,897
Int. Cl. H01r *13/62*
U.S. Cl. 339—65 11 Claims

ABSTRACT OF THE DISCLOSURE

A carrier for a transistor outline semiconductor device has a carrier base structure supporting funnel-like lead entrances adjacent the several openings extending through the base structure. The walls of at least some of the openings are provided with a constriction to frictionally engage a lead and retain the same therein. A central standoff post is provided. The device may include funnel-like entrances opposed to the lead entrances for contacts.

This invention relates to a carrier for a transistor outline semiconductor device. More particularly, this invention relates to a carrier for a transistor outline semiconductor device with a carrier base structure so that the transistor outline devices supported therein may be manipulated and operated upon by existing equipment for handling integrated circuit devices.

Special handling techniques have been developed for integrated circuits. These techniques have included the development of carriers which retain and protect the integrated circuit packages. The purpose of the present invention is to apply the techniques developed for handling integrated circuit package devices to transistors outline semiconductor devices. In accordance with the present invention a known standard base structure for an integrated circuit carrier supports a holder for a transistor outline semiconductor device. The base structure is a universal carrier with a standardized carrier outline provided with polarizing notches and slots and has dimensions which fit well with existing handling equipment. At the same time, the transistor outline socket provides a new and unobvious means for retaining the semiconductor device. In addition, the transistor outline socket is provided with means for ready and sure connection with contacting devices.

As used herein, the term "transistor outline" describes a semiconductor device having the conventional outline of a transistor; that is, the device includes a plurality of leads concentric with and parallel to the longitudinal axis of a cylindrical body which encapsulates the semiconductor.

For the purpose of illustrating the invention, there are shown in the drawings forms which are presently preferred; it being understood, however, that this invention is not limited to the precise arrangements and instrumentalities shown.

Figures 1, 2:
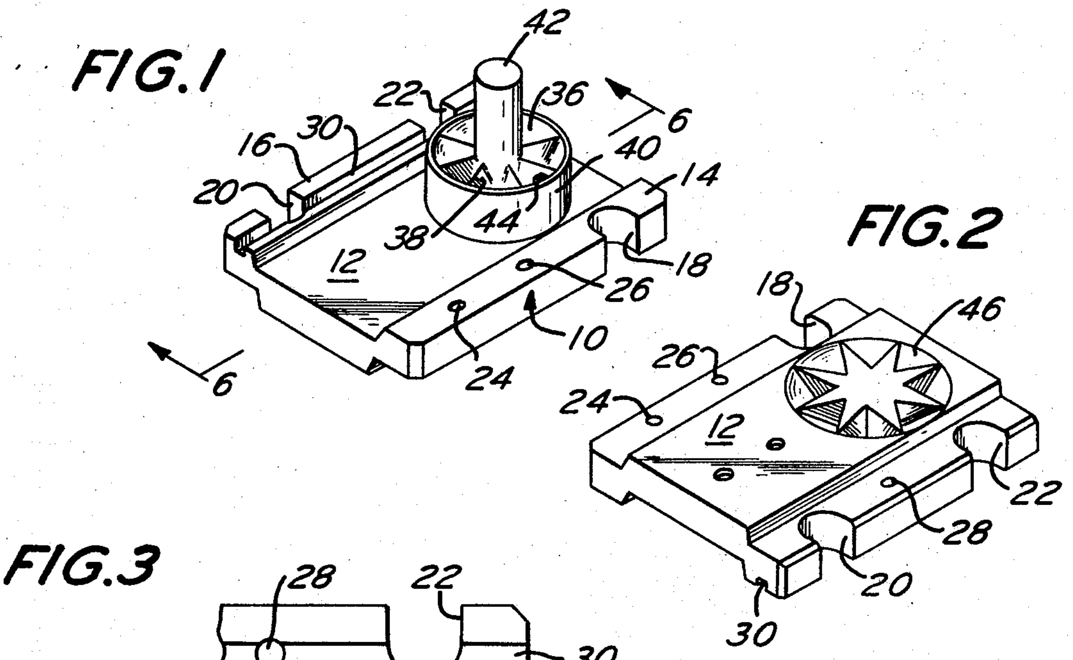
FIG. 1 is a perspective view showing the top surface, front and one side of a carrier for a transistor outline semiconductor device in accordance with the present invention.
FIG. 2 is a perspective view showing the bottom surface of the carrier illustrated in FIG. 1.
Figure 3:
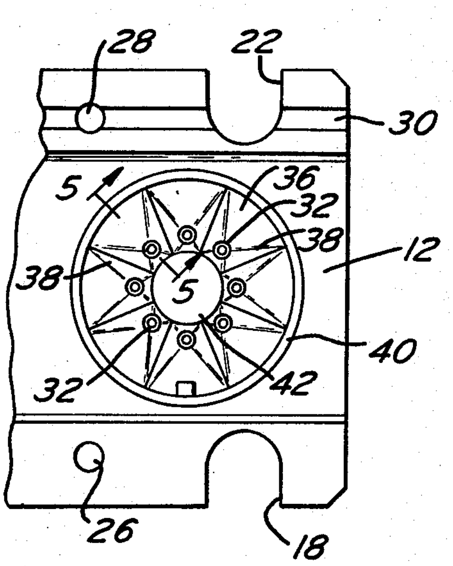
FIG. 3 is an enlarged partial top plan view of the carrier illustrated in FIG. 1.

Referring now to the drawings in detail, wherein like numerals indicate like elements, there is shown in FIGS. 1, 2, 3, 4 and 5 a carrier for a transistor outline semiconductor device designated generally as 10.

The device 10 includes a base 12 taking the general form of a rectangular parallelepiped and having flanges 14 and 16. The flanges 14 and 16 are designed so that the carrier 10 may be manipulated either manually or by a well known manner. Flange 14 is provided with polarization notch 18 and the flange 16 is provided with polarization notches 20 and 22. The polarization notches 18, 20 and 22 are generally U-shaped to cooperate with circular indexing poles in the automatic handling equipment. Holes 24, 26 and 28 extend through flanges 16 and 18 as shown. In addition, a longitudinal slot 30 extends the length of flange 16 as shown. The holes 24–28, slot 30 and notches 18–22 cooperate with mechanical handling equipment in a well known manner. The position, number and type of notches, holes and slots provided in the carrier 10 are basically a matter of the requirements necessary to make the carrier siutable for fully mechanized loading, feeding, sorting, marking, testing and classification. Because they play no part in the present invention, the manner in which they cooperate with the mechanical handling equipment is not described in detail. It is sufficient to point out that the base 12 has a standard carrier outline.

A plurality of openings 32 extend through the base 12 at points spaced about the circumference of a circle located adjacent one end of the base 12. The openings 32 receive the leads of a transistor outline integrated circuit or other conductor device. Such leads extend through the openings and may be engaged adjacent their distal ends by a contact for a contactor device. In the embodiment shown in FIGS. 1–5, there are eight openings 32. However, those skilled in the art will readily recognize that there may be a greater or lesser number of openings depending upon the type of semiconductor device to be supported by the carrier 10.

Figure 5:
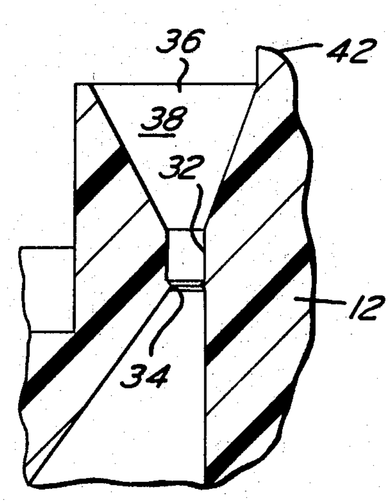
FIG. 5 is a partial sectional view of the carrier illustrated in FIG. 3 taken along the line 5—5.
Figure 4:
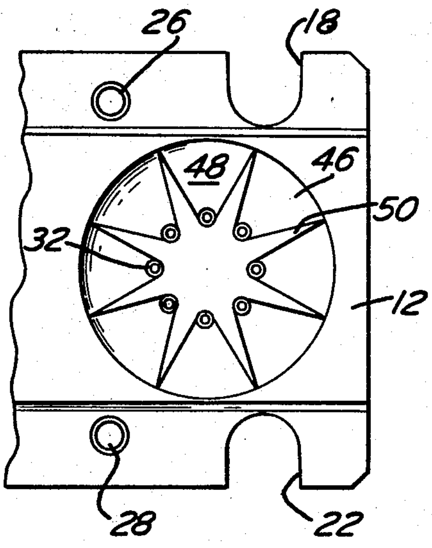
FIG. 4 is an enlarged partial bottom plan view of the carrier illustrated in FIG. 1.

As best shown in FIG. 5, the opening 32 is constricted by a ring-like projection 34. The diameter of the opening 32 is preferably slightly larger than the diameter of the leads extending from a semiconductor device. The diameter of the constricting ring 34 is preferably equal to or smaller than the diameter of the semiconductor leads and hence frictionally engages them. Thus, the constricting ring 34 forms a frictional retention means within the cpenings 32 to hold the semiconductor device on the carrier 10. In the preferred embodiment, less than all of the openings 32 are providde with constricting rings 34. Provision of constricting rings 34 in every other opening 32 provides more than a sufficient retention force.

Each opening 32 is provided with a lead entrance 36 defined by the radially extending wall structures 38 and the circular wall structure 40. The radial walls 38 as well as the circular wall 40 converge inwardly toward the opening 32 so as to define a funnel-like lead entrance.

As thus provided, the leads of the semiconductor device are guided into the openings 32 even though they may be slightly bent or misaligned.

In the illustrated embodiment, the side of each wall 38 as well as the inner side of wall 40 is planar. Thus, each lead entrance 36 is generally prismatic. Each wall 38 progressively grows thicker as it approaches base 12. In this way, each wall 38 can have two sides, one of which defines a wall for adjoining lead entrances 36. In a like manner, the width of wall 40 becomes thicker as it approaches the base 12. However, the outside of wall 40 is preferably perpendicular to the base 12.

A post 42 is centrally located within the circle defined by the opening 32. Post 42 defines a standoff for limiting the approach of the semiconductor body toward the base 12. The height of post 42 is preferably shown so that the ends of the semiconductor device leads are flush with the bottom surface of the device 10, or spaced just inside of it. The walls 38 extend radially from the post 42. As shown in FIG. 5, the post 42 progressively thickens near its base so that it also forms a part of the lead entrance, but this is not necessary.

If desired, a polarization index 44 may extend from the wall 40 into one of the lead entrances 36 for mating the leads on the semiconductor device with the correct openings 32.

A plurality of contact entrances 46 are provided in the bottom surface of base 12. The contact entrances 46 are similar to the lead entrances 36 in that they are defined by wall structure which defines a prismatic contact entrance. The circular wall 48 is frusto-conical and slopes directly to the openings 32. The sides of walls 50 are perpendicular to the surface of base 12 and extend radially outwardly from the openings 32 to the wall 48. This structure permits the leads of a contactor device to slide into the contact entrances 46 and engage the semiconductor leads against the circular bight 52 between the side walls of adjoining walls 50. In this manner the semiconductor leads are engaged without being deformed and good electrical contact is made.

Figure 6:
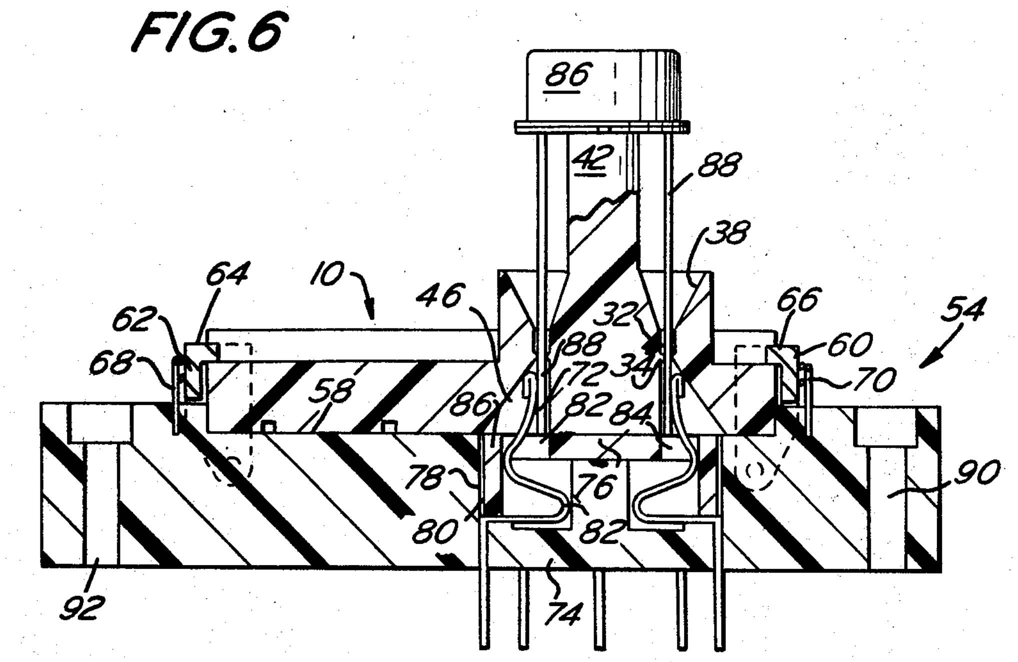
FIG. 6 is a longitudinal sectional view of the carrier illustrated in FIG. 1 taken along the line 6—6 and showing the carrier mounted in a contactor.

Referring now to FIG. 6, the manner in which a carrier in accordance with the present invention supports a transistor outline semiconductor device in association with a contactor is illustrated. In FIG. 6, the contactor designated generally by the numeral 54 includes a body portion 56 in the form of a rectangular parallelepiped. The body portion 56 includes a central recess 58 adapted to receive the base 12. Latches 60, 62 are pivotably secured to the body portion 56. The latches 60, 62 include flanges 64 and 66 adapted to overlie portions of the base 12 between the flanges 14 and 16. Biasing springs 68 and 70 are preferably provided for the latches 60, 62, and bias the latches to base-overlying positions to retain the base 12 in the recess 58.

An array of resilient contacts 72 is provided in the contactor 54. In one form of the contactor 54, the contacts 72 are retained by upper and lower retaining elements 74, received in a generally vertically disposed bore 78 in the body portion 56. The bore 78 has a plurality of circumferentially spaced, axially extending grooves 80 of semi-circular cross-section therein. Complemental semi-circular grooves, seen only in cross-section in FIG. 6, are provided in the retaining element 74 or juxtapositioned to the grooves 80.

Resilient contacts 72 are received in the grooves 80 and the juxtaposed grooves in retaining element 74. The contacts 72 extend upwardly into the contact entrances 46 of the carrier 10. Retaining element 76, seen in cross-section in FIG. 6, includes a flat upper portion having slots 82, 84 therein for receiving the contacts 72, and a depending skirt 86 of circular cross-section. The skirt 86 is complemental with the bore 78.

FIG. 6 also illustrates the manner in which a transistor-outline semi-conductor device 86 may be associated with the carrier 10 in electrical contact with the contacts 72.

Leads 88 of the device 86 extend through the lead entrances 38, openings 32 and ring-like constrictions 34. The leads 88 also extend beyond the ring-like constrictions 34 into the contact entrances 46. In the contact entrances 46, the leads 88 make electrical contact with the contacts 72. It should be apparent that the circular wall 48 serves to "cam" ends of the contacts 82 into engagement with the leads 84, thereby ensuring proper electrical contact therebetween.

As is apparent from FIG. 6, means for securing the contactor 54 to a larger assembly may be provided. For example, clearance holes 90 and 92, adapted to receive screws or bolts, may be provided.

Figure 7:
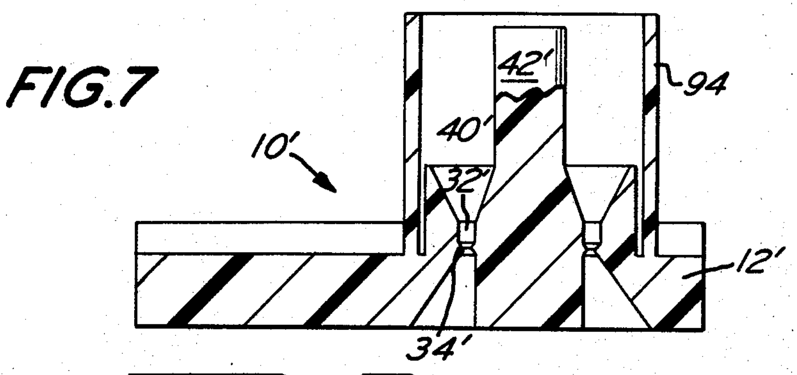
FIG. 7 is a longitudinal sectional view of a carrier illustrating the second embodiment of this invention.
Figure 8:
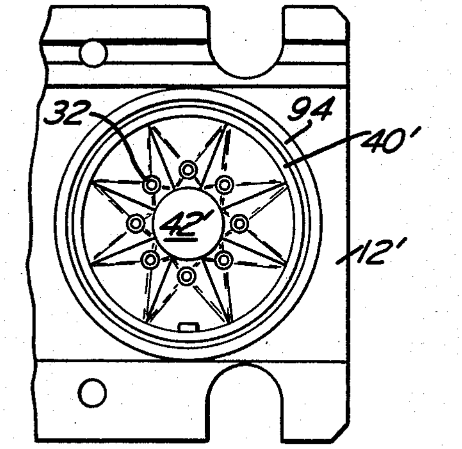
FIG. 8 is an enlarged top plan view of the carrier illustrated in FIG. 7.

Referring now to FIGS. 7 and 8, there is seen an alternative form of the present invention, wherein elements corresponding to those already described are designated by like primed reference numerals.

The carrier 10′ is substantially identical in construction to the form of the invention previously described, except for the provision of an upstanding wall 94 of circular cross-section extending upwardly from the base 12′, and concentric with the circular wall structure 40′. The wall 94 provides a protective shroud for the leads of a semiconductor device, not shown, associated with the carrier 10′.

Figure 9:
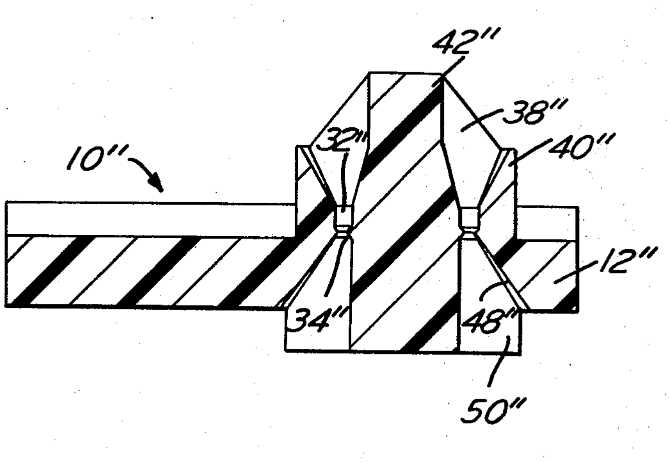
FIG. 9 is a longitudinal sectional view of a carrier forming a third embodiment of the present invention.
Figure 10:
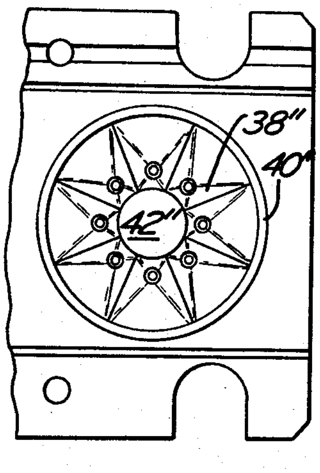
FIG. 10 is an enlarged partial top plan view of the carrier illustrated in FIG. 9.

Yet another embodiment of the present invention appears in FIGS. 9 and 10. In the embodiment shown in FIGS. 9 and 10, elements corresponding to those previously described are designated by like double primed reference numerals.

The device 10″ includes a base 12″, circular wall 40″ and post 42″. Radial walls 38″ extend between the post 42″ and circular wall 40″. The base 12″ also includes a circular wall 48″. Radially extending walls 50″ extend between a lower portion of the post 42″ and the circular wall 48″. The walls 50″ extend axially of the post 42″. In the particular embodiment shown in FIGS. 9 and 10, the post 42″ and walls 50″ extend downwardly beyond the bottom surface of the base 12″. Also, the radial walls 38″ extend from an upper edge of the circular wall 40″ to a point adjacent the upper surface of the post 42″. The configuration of the walls 50″ provides a contact area somewhat greater than that of the previously described embodiments. Also, the sloped walls 38″ provide somewhat better guidance for the leads of the semi-conductor device, not shown, during loading.

Figure 12:
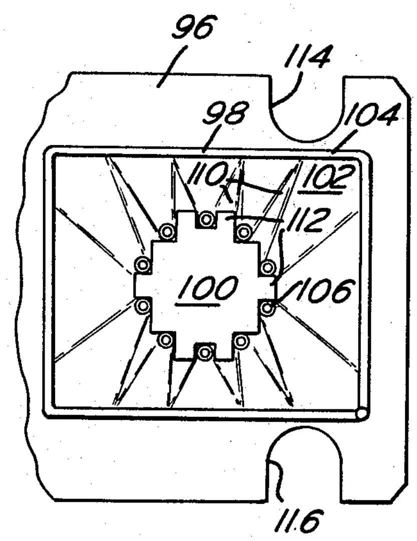
FIG. 12 is a partial top plan view of the carrier illustrated in FIG. 11.
Figure 11:
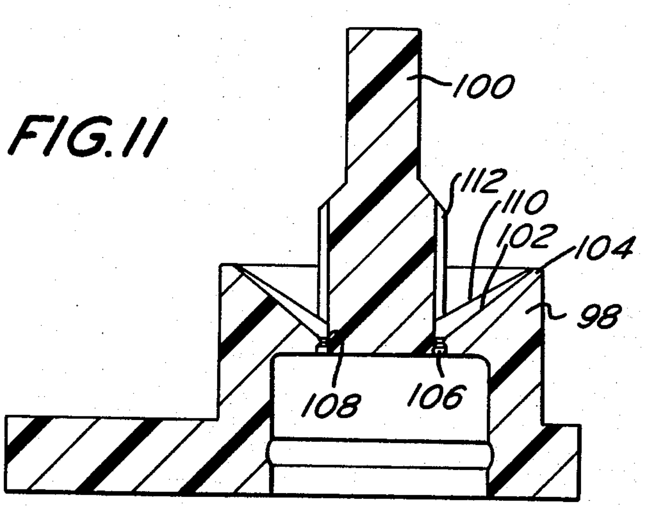
FIG. 11 is longitudinal sectional view of a carrier forming a fourth embodiment of the present invention.

A still further embodiment of the present invention is shown in FIGS. 11 and 12. In the embodiment of FIGS. 11 and 12, a base 96 is provided with a raised wall portion 98 of rectangular cross-section. Inwardly sloping walls 102 extend between a flat upper surface 104 of the raised wall portion 98 and the post 100. Openings 106, corresponding to the previously described openings 32, are disposed at the intersections of the walls 102 and post 100. Constricting rings 108 are provided in the openings 106.

Pyramidal walls 110 radiate from the post 100, and separate the walls 102. The walls 110 slope inwardly toward the post 100 at a somewhat lesser slope than the walls 102. Thus, the walls 110 serve as guides for the leads of the semi-conductor as it is inserted into the carrier. Further loading guidance is derived from vertically extending flutes vertically extending flutes 112 extending from a widened lower portion of the post 100. The flutes 112 extend beyond the wall 98. In this manner contact with semi-conductor lead can be made from a side approaching position.

The base 96 is provided with polarization notches 114, 116, as in the previously described embodiments.

The carriers of the present invention are preferably molded in a single piece of plastic polymeric material. Any plastic polymeric material having suitable mechanical and electrical properties may be used. In a preferrerd form, the carriers are molded in polysulfone.

The present invention may be embodied in other specific forms without departing from the spirit or essential attributes thereof and, accordingly, reference should be made to the appended claims, rather than to the foregoing specifically as indicating the scope of the invention.

It is claimed:

1. A carrier for a transistor outline semiconductor device comprising a base structure, retention means for retaining a semiconductor device on said base, said retention means comprising a plurality of openings for leads extending through said base, said base supporting funnel-like structures converging toward each opening, at least one of said openings being of a size to frictionally engage a lead of a semiconductor device to retain the same in said opening, and upstanding post defining a stand-off extending beyond said wall structures, said wall structures including walls extending radially from said post and an outer wall enclosing said radially extending walls, said outer wall abutting the terminus of said radially extending walls, and the topmost surface of said radially extending walls slopes from a point on said post above said outer wall toward said base structure.

2. A carrier for a transistor outline semiconductor device including a base structure, retention means for retaining a semiconductor device on said base, said retention means comprising a plurality of openings for leads extending through said base, said base supporting funnel-like structures converging toward each opening, at least one of said openings being of a size to frictionally engage a lead of a semiconductor device to retain the same in said opening, and a protective wall surrounding said wall structures.

3. A carrier for a transistor-outline semiconductor device comprising a base structure, retention means for retaining a semiconductor device on said base, said retention means comprising a plurality of openings for leads extending through said base, said base supporting funnel-like wall structures converging towards each opening, at least one of said openings being of a size to frictionally engage a lead of a semiconductor device to retain the same in said opening, a plurality of funnel-like wall structures opposed to said first-mentioned funnel-like wall structures and converging toward each opening, said base structure being substantially a rectangular parallelepiped, said first-mentioned wall structures being supported on one surface of said base structure, polarizing means formed in the walls and surfaces of said base structure, and an upstanding post defining a standoff extending beyond said wall structure.

4. A carrier for a transistor-outline semiconductor device in accordance with claim 3 including a protective wall surrounding said wall structures.

5. A carrier for a transistor-outline semiconductor device in accordance with claim 3 wherein said wall structures include radially extending walls and an outer wall enclosing said walls, said outer wall abutting the terminus of said radially extending walls.

6. A carrier for a transistor-outline semiconductor device in accordance with claim 5 including a protective device surrounding said wall structures.

7. A carrier for a transistor-outline semiconductor device in accordance with claim 3 wherein said first-mentioned wall structures include walls extending radially from said post, an outer wall enclosing said radially extending walls, said outer wall abutting the terminus of said radially extending walls, and the topmost surface of said radially extending walls sloping from a point on said post above said outer wall toward said base structure.

8. A carrier for a transistor-outline device in accordance with claim 7 including a protective wall surrounding said wall structures.

9. A carrier for a transistor-outline semiconductor device in accordance with claim 7 wherein said opposed wall structures extend outwardly from said base structure.

10. A carrier for a transistor-outline semiconductor device comprising a base structure, retention means for retaining a semiconductor device on said base, said retention means comprising a plurality of openings for leads extending through said base, said base supporting a first plurality of funnel-like wall structures converging toward each opening, at least one of said openings being of a size to frictionally engage a lead of a semiconductor device to retain the same in said opening, a second plurality of funnel-like wall structures opposed to said first plurality of funnel-like wall structures converging toward each opening, said second plurality of funnel-like wall structures containing support walls positioned to be substantially parallel to electrical leads extending through said openings.

11. A carrier for a transistor outline semiconductor device comprising a base structure, retention means for retaining a semiconductor device on said base, said retention means comprising a plurality of openings for leads extending through said base, said base supporting first and second pluralities of opposed funnel-like structures, converging toward each opening, at least one of said openings being of a size to frictionally engage a lead of a semiconductor device to retain the same in said opening.

References Cited

UNITED STATES PATENTS

| | | | |
|---|---|---|---|
| 2,986,675 | 5/1961 | Burson et al. | 317—101 |
| 3,187,125 | 6/1965 | Bergauer | 200—51.05 |
| 3,388,210 | 6/1968 | Babb | 174—138.5 |
| 3,414,869 | 12/1968 | Pascua | 339—193 |
| 3,427,550 | 2/1969 | Helda et al. | 339—36 |

MARVIN A. CHAMPION, Primary Examiner

J. H. McGLYNN, Assistant Examiner

U.S. Cl. X.R.

339—193

Disclaimer 3,516,044.—*James W. Barnes*, Drexel Hill, and *Rexford W. Van De Boe*, Broomall, Pa. CARRIER FOR TRANSISTOR OUTLINE SEMI-CONDUCTOR DEVICE. Patent dated June 2, 1970. Disclaimer filed Aug. 7, 1970, by the assignee, *Barnes Corporation*.

Hereby enters this disclaimer to claims 1 and 2 of said patent.

[*Official Gazette December 8, 1970.*]